(12) United States Patent
Zhu et al.

(10) Patent No.: US 11,038,344 B2
(45) Date of Patent: Jun. 15, 2021

(54) SHUNT POWER RAIL WITH SHORT LINE EFFECT

(71) Applicant: QUALCOMM Incorporated, San Diego, CA (US)

(72) Inventors: John Jianhong Zhu, San Diego, CA (US); Xiangdong Chen, San Diego, CA (US); Haining Yang, San Diego, CA (US); Kern Rim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 133 days.

(21) Appl. No.: 16/362,417

(22) Filed: Mar. 22, 2019

(65) Prior Publication Data

US 2020/0044440 A1    Feb. 6, 2020

Related U.S. Application Data

(60) Provisional application No. 62/712,862, filed on Jul. 31, 2018.

(51) Int. Cl.
*H02H 9/04* (2006.01)
*H02J 7/00* (2006.01)
*H01Q 1/22* (2006.01)

(52) U.S. Cl.
CPC .......... *H02H 9/044* (2013.01); *H01Q 1/2283* (2013.01); *H02H 9/046* (2013.01); *H02J 7/0016* (2013.01)

(58) Field of Classification Search
CPC ....... H02H 9/044; H02H 9/046; H02J 7/0016; H01Q 1/2283
USPC ...................................................... 361/55, 56
See application file for complete search history.

(56) References Cited

U.S. PATENT DOCUMENTS

| | | | |
|---|---|---|---|
| 2016/0104674 A1* | 4/2016 | Hsieh ................ | H01L 23/53271 257/741 |
| 2016/0351654 A1* | 12/2016 | Oh ...................... | H01L 23/5223 |
| 2017/0170162 A1* | 6/2017 | Pincu ................ | H03K 19/17784 |
| 2018/0175060 A1* | 6/2018 | Zhu ..................... | H01L 23/5286 |

* cited by examiner

*Primary Examiner* — Yemane Mehari
(74) *Attorney, Agent, or Firm* — Qualcomm Incorporated

(57) ABSTRACT

A cell circuit includes a first power rail, having a first line length, in a first layer. The first power rail is configured to receive a first voltage for the cell circuit. The cell circuit includes multiple lines in a second layer and a shunt in a third layer. The shunt is electrically coupled to the first power rail and a first set of lines of the multiple lines. The shunt has a second line length shorter than the first line length. The cell circuit includes another shunt in t the third layer. The other shunt is also parallel to the first power rail. The other shunt is electrically coupled to the first power rail and a second set of lines of the multiple lines. The other shunt has a third line length shorter than the first line length.

17 Claims, 9 Drawing Sheets

SHUNT POWER RAIL WITH SHORT LINE EFFECT

CROSS-REFERENCE TO RELATED APPLICATION

The present application claims the benefit of U.S. Provisional Patent Application No. 62/712,862, filed on Jul. 31, 2018, and titled "SHUNT POWER RAIL WITH SHORT LINE EFFECT," the disclosure of which is expressly incorporated by reference herein in its entirety.

TECHNICAL FIELD

The present disclosure generally relates to cell circuits. More specifically, the present disclosure relates to a cell circuit having a shunt power rail with short line effect to mitigate risks associated with electron migration.

BACKGROUND

The design complexity of mobile radio frequency (RF) transceivers is complicated by added circuit functions and devices to support communication enhancements. For example, advances in technology have resulted in cellular communication standards and protocols, such as fifth generation (5G) new radio (NR) millimeter wave (mmW) using physically small antenna arrays that contain multiple antenna elements. The complexity is further heightened by the desire to support multiple frequency bands in the millimeter wave frequency range, such as frequency bands located near 24 gigahertz (GHz), 26 GHz, 28 GHz, 37 GHz, 39 GHz, 48 GHz, and 56 to 71 GHz. Processor-based computer systems can include a vast array of integrated circuits (ICs).

Each IC has a complex layout design comprised of multiple IC devices. Standard cell circuits are often employed to assist in making the design of ICs less complex and more manageable. For example, standard cell circuits provide a designer with pre-designed cells corresponding to commonly used IC devices that conform to specific design rules of a chosen technology. As non-limiting examples, standard cell circuits may include gates, inverters, multiplexers, and adders. Using standard cell circuits enables a designer to create ICs having consistent layout designs, thereby creating a more uniform and less complex layout design across multiple ICs, as compared to custom designing each circuit.

Conventional standard cell circuits are fabricated using process technologies that form device elements with a pre-defined technology node size. For example, a process technology may be employed to fabricate a conventional standard cell circuit with device elements fourteen (14) nanometers (nms) or ten (10) nms wide. Improvements in fabrication processes and related technologies are enabling decreases in technology node size, which allows a higher number of device elements, such as transistors, to be disposed in less area within a circuit. As technology node size scales down, gate and metal lines within a conventional standard cell circuit also scale down to reduce the area of a conventional standard cell circuit. The standard cell circuit may scale down in area by reducing a total height. For example, a gate length can be scaled down to reduce a width of a conventional standard cell circuit, and metal line width can be scaled down to reduce the cell height. However, continuous integrated circuit scaling drives a reduction in the standard cell height, and consequently a reduction in widths of metal power rails and metal shunt power rails. The reduction in the widths of metal power rails and the metal shunt power rails leads to an increasing risk of electron migration (EM).

SUMMARY

A cell circuit includes a first power rail having a first line length. The first power rail is in a first conductive layer. The first power rail is configured to receive a first voltage for the cell circuit. The cell circuit also includes a plurality of conductive lines in a second conductive layer. The cell circuit also includes a first conductive shunt in a third conductive layer. The first conductive shunt is electrically coupled to the first power rail and a first set of conductive lines of the plurality of conductive lines. The first conductive shunt has a second line length that is shorter than the first line length. The cell circuit further includes a second conductive shunt in the third conductive layer. The second conductive shunt is electrically coupled to the first power rail and a second set of conductive lines of the plurality of conductive lines. The second conductive shunt has a third line length that is shorter than the first line length.

A method of fabricating a cell circuit includes fabricating a first power rail having a first line length. The first power rail is in a first conductive layer. The first power rail is configured to receive a first voltage for the cell circuit. The method also includes fabricating a plurality of conductive lines in a second conductive layer. The method also includes fabricating a first conductive shunt in a third conductive layer. The first conductive shunt is electrically coupled to the first power rail and a first set of conductive lines of the plurality of conductive lines. The first conductive shunt has a second line length that is shorter than the first line length. The method further includes fabricating a second conductive shunt in the third conductive layer. The second conductive shunt is electrically coupled to the first power rail and a second set of conductive lines of the plurality of conductive lines. The second conductive shunt has a third line length that is shorter than the first line length.

A cell circuit includes means for receiving a first voltage for the cell circuit. The first voltage receiving means has a first line length. The first voltage receiving means is in a first conductive layer. The cell circuit also includes a plurality of conductive lines in a second conductive layer. The cell circuit also includes a first conductive shunt in a third conductive layer. The first conductive shunt is electrically coupled to the first voltage receiving means and a first set of conductive lines of the plurality of conductive lines. The first conductive shunt has a second line length that is shorter than the first line length. The cell circuit further includes a second conductive shunt in the third conductive layer. The second conductive shunt is electrically coupled to the first voltage receiving means and a second set of conductive lines of the plurality of conductive lines. The second conductive shunt has a third line length that is shorter than the first line length.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
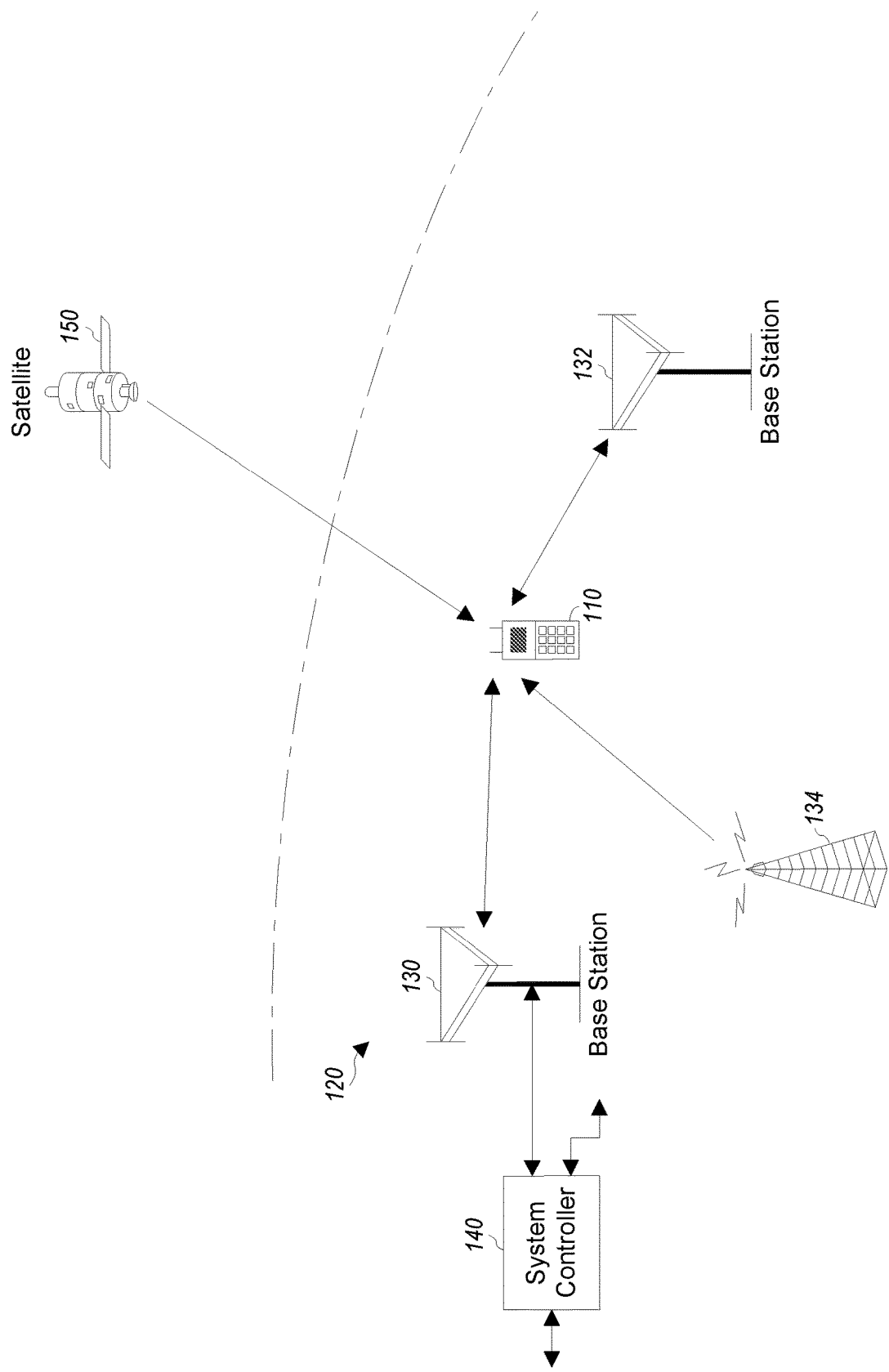
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Cell-based designs (e.g., standard cell circuits) have power rails that supply voltage potentials such as Vdd or Vss to the cells. Continuous integrated circuit scaling drives a reduction in a standard cell circuit height, and consequently, a reduction in widths of conductive (e.g., metal) power rails and conductive (e.g., metal) shunt power rails. However, the power rails and the shunt power rails are limited or constrained by direct current specifications.

The reduction in the widths leads to an increasing risk of electron migration (EM) associated with, for example, the metal shunt power rail. Electron migration is the transport of material caused by the gradual movement of the ions (e.g., copper ions) in a conductor due to the momentum transfer between conducting electrons and diffusing metal atoms. The migration of the ions of the conductor can result in a physical breakage of the conductor in the regions depleted of the ions. One way to reduce the risk of electron migration is to increase the width of a metal shunt power rail. However, increasing the width of the metal shunt power rail can cause an expensive place and route (P&R) resource (or track) loss.

Aspects of the present disclosure are directed to a cell circuit that mitigates shunt power rail electron migration while reducing place and route resource loss. For example, the cell circuit includes a first power rail that has a first line length. The first power rail is in a first conductive layer. The first power rail is configured to receive a first voltage for the cell circuit. The cell circuit includes a plurality of conductive lines in a second conductive layer that are orthogonal to the first power rail.

The cell circuit further includes a first conductive shunt (or first conductive shunt power rail) in a third conductive layer. The first conductive shunt is parallel to the first power rail. The first conductive shunt is electrically coupled to the first power rail and a first set of conductive lines of the plurality of conductive lines. The first conductive shunt has a second line length shorter than the first line length. Furthermore, the cell circuit includes a second conductive shunt (or second conductive shunt power rail) in the third conductive layer. The second conductive shunt is also parallel to the first power rail. The second conductive shunt is electrically coupled to the first power rail and a second set of conductive lines of the plurality of conductive lines. The second conductive shunt has a third line length shorter than the first line length.

The cell circuit further includes a first set of vias, a second set of vias, and a third set of vias. The first set of vias are between the first conductive layer and the second conductive layer. Each of the first set of vias electrically couples the first power rail to the plurality of conductive lines in the second conductive layer. The second set of vias are between the second conductive layer and the first conductive shunt. Each of the second set of vias electrically couples the first set of conductive lines to the first conductive shunt. The third set of vias are between the second conductive layer and the second conductive shunt. Each of the third set of vias electrically couples the second set of conductive lines to the second conductive shunt.

The cell circuit also includes a second power rail, a third conductive shunt, and a fourth conductive shunt. The second power rail includes a fourth line length and is in a second row of the first conductive layer. The second power rail is configured to receive a second voltage for the cell circuit, in which the first voltage is different from the second voltage. For example, the first voltage has a positive polarity and the second voltage has a negative polarity. The third conductive shunt is in a second row of the third conductive layer and electrically coupled to the second power rail and a third set of conductive lines of the plurality of conductive lines. The third conductive shunt includes a fifth line length shorter than the fourth line length. The fourth conductive shunt is in the second row of the third conductive layer and is electrically coupled to the second power rail and a fourth set of conductive lines of the plurality of conductive lines. The fourth conductive shunt has a sixth line length shorter than the fourth line length.

A first space or gap between the first conductive shunt and the second conductive shunt is aligned with a second space between the third conductive shunt and the fourth conductive shunt. In some aspects, the first space between the first conductive shunt and the second conductive shunt is staggered relative to the second space between the third conductive shunt and the fourth conductive shunt. Each of the second line length and the third line length is between approximately two (2) micrometer (μm) and ten (10) μm.

In some aspects, the third conductive shunt and the fourth conductive shunt may be replaced with a continuous conductive shunt in the second row of the third conductive layer. The continuous conductive shunt is electrically coupled to the second power rail as well as the third set of conductive lines and the fourth set of conductive lines of the plurality of conductive lines. The continuous conductive shunt has a fifth line length substantially equal to the fourth line length.

FIG. 1 shows a wireless device 110 that includes the described cell circuit. The wireless device 110 communicates with a wireless communication system 120. The wireless communication system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Some carrier aggregation implementations in the sub 6 GHz include multiple frequency bands in the millimeter wave frequency range, such as frequency bands located near 24 gigahertz (GHz), 26 GHz, 28 GHz, 37 GHz, 39 GHz, 48 GHz, and 56 to 71 GHz. For example, these bands may include 24.25-24.45 GHz, 24.75-25.25 GHz, 27.5-28.35 GHz, and 37-40 GHz. In these systems, the carriers may be 50 MHz, 100 MHz, 200 MHz, or 400 MHz and the bands may be up to 2.4 GHz and may include one or more carriers.

Figure 2:
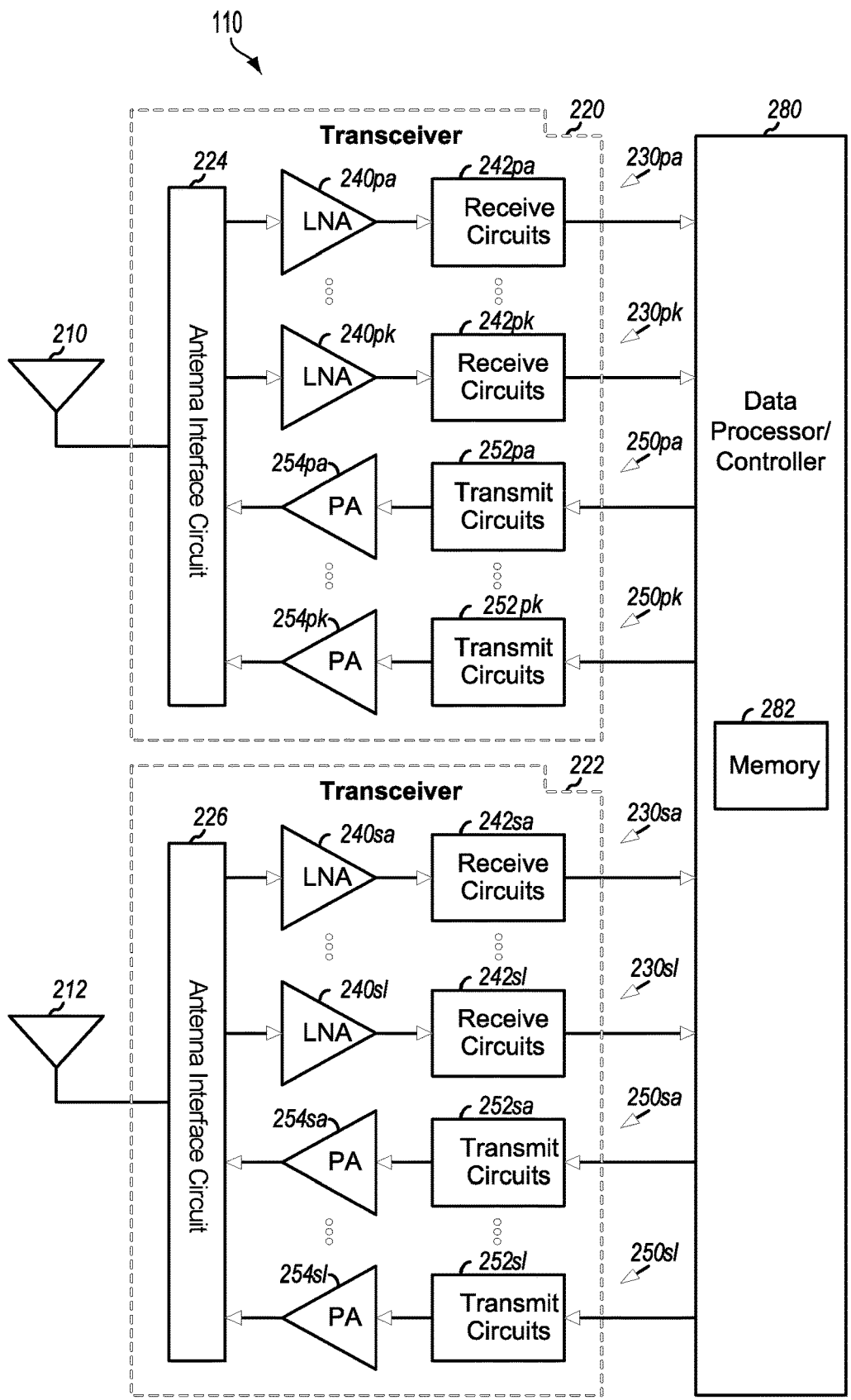
FIG. 2 shows a block diagram of the wireless device in FIG. 1, according to an aspect of the present disclosure.

FIG. 2 shows a block diagram of an exemplary design of wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230$pa$ to 230$pk$ and multiple (K) transmitters 250$pa$ to 250$pk$ to support multiple frequency bands, multiple radio technologies, carrier aggregation, etc. The transceiver 222 includes L receivers 230$sa$ to 230$s1$ and L transmitters 250$sa$ to 250$s1$ to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, the antenna 210 receives signals from base stations and/or other transmitter stations and provides a received radio frequency (RF) signal, which is routed through an antenna interface circuit 224 and presented as an input RF signal to a selected receiver 230. An antenna interface circuit 224 may include switches, duplexers, transmit filters, receive filters, matching circuits, etc. The description below assumes that the receiver 230$pa$ is the selected receiver. Within the receiver 230$pa$, an LNA 240$pa$ amplifies the input RF signal and provides an output RF signal. Receive circuits 242$pa$ downconvert the output RF signal from RF to baseband, amplify and filter the downconverted signal, and provide an analog input signal to data processor 280. Receive circuits 242$pa$ may include mixers, filters, amplifiers, matching circuits, an oscillator, a local oscillator (LO) generator, a phase locked loop (PLL), etc. Each remaining receiver 230 in the transceivers 220 and 222 may operate in a similar manner as the receiver 230$pa$.

In the exemplary design shown in FIG. 2, each transmitter 250 includes transmit circuits 252 and a power amplifier (PA) 254. For data transmission, a data processor 280 processes (e.g., encodes and modulates) data to be transmitted and provides an analog output signal to a selected transmitter. The description below assumes that the transmitter 250$pa$ is the selected transmitter. Within the transmitter 250$pa$, transmit circuits 252$pa$ amplify, filter, and upconvert the analog output signal from baseband to RF and provide a modulated RF signal. The transmit circuits 252pa may include amplifiers, filters, mixers, matching circuits, an oscillator, an LO generator, a PLL, etc. A power amplifier (PA) 254pa receives and amplifies the modulated RF signal and provides a transmit RF signal having the proper output power level. The transmit RF signal is routed through the antenna interface circuit 224 and transmitted via the antenna 210. Each remaining transmitter 250 in the transceivers 220 and 222 may operate in a similar manner as the transmitter 250pa.

FIG. 2 shows an exemplary design of a receiver 230 and transmitter 250. The receiver 230 and a transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

The data processor/controller 280 may perform various functions for the wireless device 110. For example, the data processor 280 may perform processing for data being received via the receivers 230 and data being transmitted via the transmitters 250. The controller 280 may control the operation of the various circuits within the transceivers 220 and 222. In some aspects, the transceivers 220 and 222 may also comprise a controller to control various circuits within the respective transceiver (e.g., LNAs 240). A memory 282 may store program codes and data for the data processor/controller 280. The data processor/controller 280 may be implemented on one or more application specific integrated circuits (ASICs) and/or other ICs.

Figure 3:
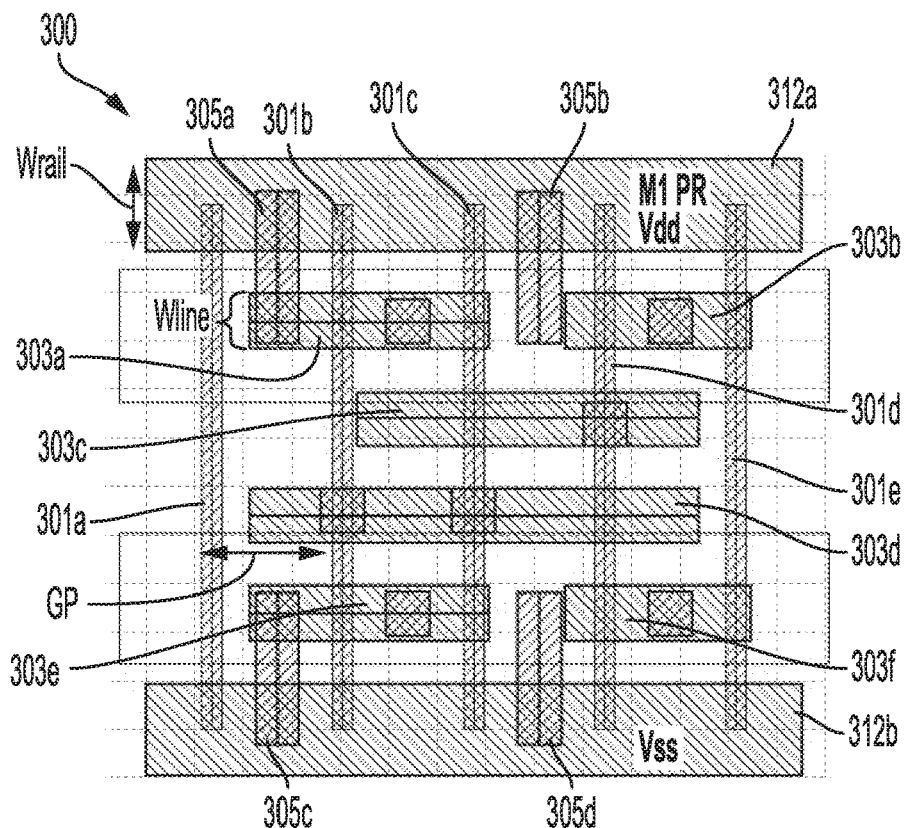
FIG. 3 is a top view of a standard cell circuit including a first power rail and a second power rail.

FIG. 3 is a top view of a standard cell circuit 300 including a first power rail 312a and a second power rail 312b. For example, the first power rail 312a corresponds to a terminal that receives a positive supply voltage (Vdd) and the second power rail 312b corresponds to a terminal that receives a negative supply voltage (Vss). The negative supply voltage may be a ground voltage. Each of the first power rail 312a and the second power rail 312b has a rail width $W_{rail}$. The standard cell circuit 300 includes active devices (not shown) that include corresponding gates 301a-301e. The gates 301a-301e are perpendicular to the first power rail 312a and the second power rail 312b and have a gate pitch GP (e.g., fifty (50) to fifty five (55) nanometers). The first power rail 312a and the second power rail 312b are included in a first conductive layer (e.g., a first back-end-of-line (BEOL) layer (M0) or a second a second BEOL layer (M1)) of the integrated circuit.

The standard cell circuit 300 also includes routing/signal lines 303a-303f in the first conductive layer. The signal lines 303a-303f are between the first power rail 312a and the second power rail 312b and are orthogonal to the gates 301a-301e. Each of the signal lines 303a-303f corresponds to a routing track, and has a line width $W_{line}$. The signal lines 303a-303f are used, in part, to interconnect elements in the standard cell circuit 300 to form various devices, such as particular logic gates. The signal lines 303a-303f are also used, in part, to interconnect elements to the first power rail 312a and the second power rail 312b. To further assist in interconnecting elements in the standard cell circuit 300, as well as to interconnect elements to the first power rail 312a and the second power rail 312b, conductive (metal) lines 305a-305d in subsequent conductive layers (e.g., a second conductive layer or a third BEOL layer (M2)) are included between the respective gates 301a-301e. The conductive lines 305a-305d are orthogonal to the first power rail 312a and the second power rail 312b.

Figure 4:
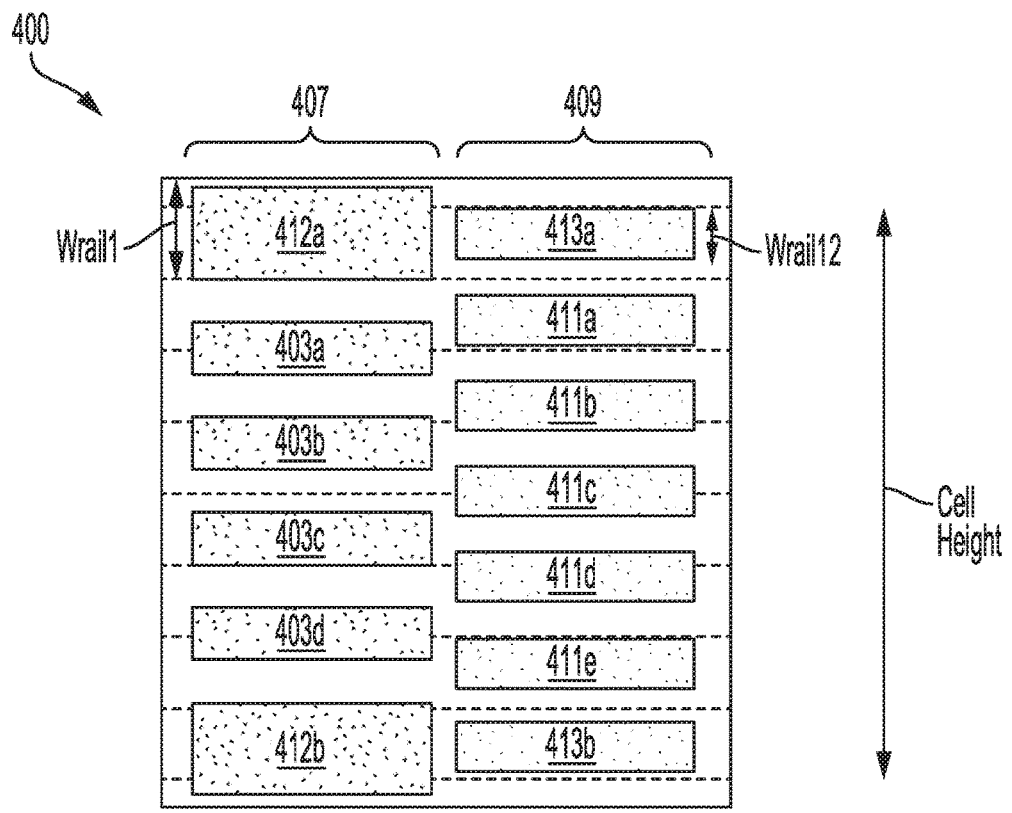
FIG. 4 illustrates a top view of one conductive layer of a standard cell circuit juxtaposed with another conductive layer of the standard cell circuit.

FIG. 4 illustrates a top view of one conductive layer (e.g., a first conductive layer 407) of a standard cell circuit 400 juxtaposed with another conductive layer (e.g., a third conductive layer 409) of the standard cell circuit 400. The first conductive layer 407 is juxtaposed with the third conductive layer 409 to illustrate design constraints of the different conductive layers. In standard cell circuit design, conductive layers (e.g., a second conductive layer (not shown)) directly above or below another conductive layer are perpendicular to the conductive layers directly above or below them. For example, signal lines 403a-403d and power rails 412a-412b of the first conductive layer 407 are perpendicular to signal lines (not shown) and shunt power rails (not shown) of the second conductive layer (not shown).

Conductive layers that are separated by one conductive layer are parallel to each other. For example, the signal lines 403a-403d and the power rails 412a-412b of the first conductive layer 407 are parallel to the signal lines 411a-411e and shunt power rails 413a-413b of the third conductive layer 409. This follows because the second conductive layer is between the first conductive layer 407 and the third conductive layer 409. The signal lines and the power rails are subject to design constraints. For example, the number of signal lines between the power rails 412a-412b of the first conductive layer 407 and signal lines between the shunt power rails 413a-413b of the third conductive layer 409 are constrained by a cell height, which is based on a design standard. For example, the total cell height of the standard cell circuit 400 is measured from a center of the power rail 412a to a center of the power rail 412b. The total cell height of the standard cell circuit 400 can also be measured from a center of the shunt power rail 413a to a center of the shunt power rail 413b. In this aspect, the power rails 412a-412b of the first conductive layer 407 and the shunt power rails 413a-413b of the third conductive layer 409 have a same continuous length.

For example, the first conductive layer 407 is constrained to four signal lines 403a-403d between the power rails 412a-412b that are wider than the shunt power rails 413a-413b of the third conductive layer 409. The third conductive layer 409 is further constrained because more signal lines (e.g., five signal lines 411a-411e) are specified between the shunt power rails 413a-413b. This means that a width $W_{rail2}$ of the shunt power rails 413a-413b are smaller than the width $W_{rail1}$ of the power rails 412a-412b. If the width $W_{rail1}$ of the of the power rails 412a-412b are not wide enough to support an increased power supply, the extra power can be supported by the shunt power rails 413a-413b. However, if the width $W_{rail2}$ of the shunt power rails 413a-413b are limited by space, the standard cell circuit 400 may encounter electron migration. In this case, the shunt power rails 413a-413b are specified for a reduced direct current Idc.

Reducing the rail width $W_{rail2}$ as a result of scaling decreases the conductive area of both the shunt power rails 413a-413b. Such a reduction in the conductive area results in both the shunt power rails 413a-413b having an increased resistance, and thus, a decrease in direct current Idc (where Idc=voltage divided by resistance (V/R)). The reduction in the direct current Idc causes the standard cell circuit 400 to be subjected to electron migration that may cause a physical break in the shunt power rails 413a-413b.

Figure 5:
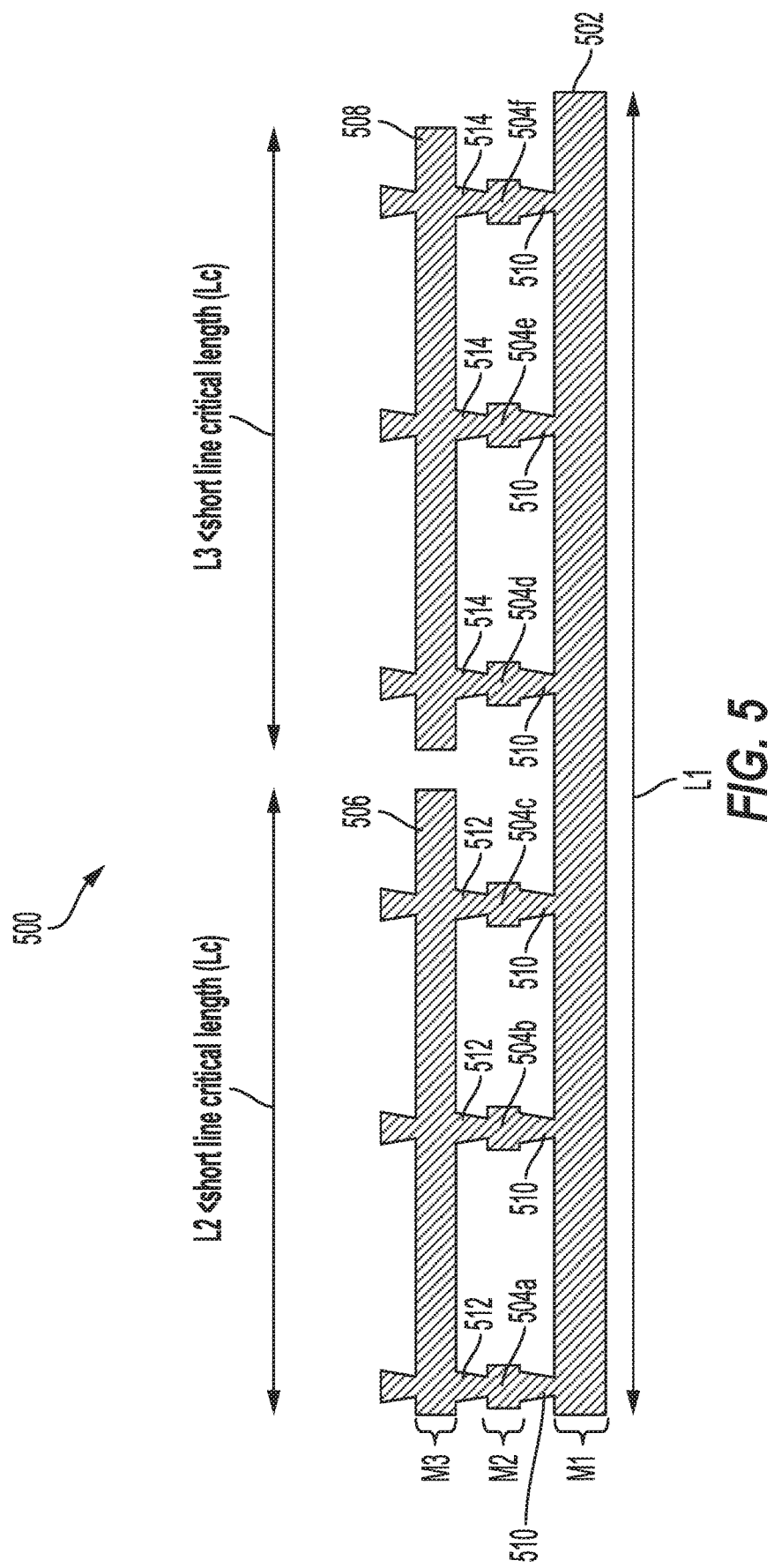
FIG. 5 illustrates a cross-section of a layout of a cell circuit in a short line configuration, according to aspects of the present disclosure.

FIG. 5 illustrates a cross-section of a layout of a cell circuit 500 in a short line configuration, according to aspects of the present disclosure. The cell circuit 500 includes a first power rail 502 that has a first line length (L1). The first power rail 502 is in a first row of a first conductive layer (e.g., layer M1). The first power rail 502 is configured to receive a first voltage for the cell circuit 500. The cell circuit 500 includes a plurality of conductive lines (e.g., 504a, 504b, 504c, 504d, 504e, and 504f) in a second conductive layer (e.g., layer M2). The process flow for semiconductor fabrication of the cell structure may include front-end-of-line (FEOL) processes, middle-of-line (MOL) processes, and back-end-of-line (BEOL) processes. The MOL process is the set of process steps that enable connection of the transistors to the back-end-of-line or BEOL interconnects (e.g., layer M1 or metal 1, layer M2, layer M3, etc.) using MOL contacts. Although metal 1 (M1), metal 2 (M2) and metal 3 (M3) are referred to throughout this document, the present disclosure is not limited to metal 1 (M1), metal 2 (M2) and metal 3 (M3), as other metal layers may be used. In one aspect, the plurality of conductive lines are perpendicular to the first power rail 502. The plurality of conductive lines 504a-504f are electrically coupled to the first power rail 502 by a first set of vias 510 between the plurality of conductive lines and the first power rail 502.

The cell circuit 500 further includes a first conductive shunt 506 (or first conductive shunt power rail) in a first row of a third conductive layer (e.g., layer M3). The first conductive shunt 506 is parallel to and electrically coupled to the first power rail 502 and a first set of conductive lines 504a, 504b, and 504c of the plurality of conductive lines. For example, the first conductive shunt 506 is electrically coupled to the first power rail 502 by a second set of vias 512 and some of the first set of vias 510. The first conductive shunt 506 is electrically coupled to the first set of conductive lines 504a, 504b, and 504c of the plurality of conductive lines by the second set of vias 512. The first conductive shunt 506 has a second line length (L2), which is shorter than the first line length L1.

Furthermore, the cell circuit 500 includes a second conductive shunt 508 (or second conductive shunt power rail) in the first row of the third conductive layer (e.g., M3). The second conductive shunt 508 is parallel to and electrically coupled to the first power rail 502 and a second set of conductive lines 504d, 504e, and 504f of the plurality of conductive lines. For example, the second conductive shunt 508 is electrically coupled to the first power rail 502 by a third set of vias 514 and some of the first set of vias 510. The second conductive shunt 508 is electrically coupled to the second set of conductive lines 504d, 504e, and 504f of the plurality of conductive lines by the third set of vias 514. In some aspects, a distance from via-to-via (e.g., between two vias 514) is 20-40 contacted poly/gate pitch (CPP) which is about one to two micrometers (1-2 µm.)

The cell circuit 500 is in the short line configuration to achieve a short line effect with respect to the first conductive shunt 506 and the second conductive shunt 508 of the cell circuit 500. Short line effect occurs when a stress gradient that builds up during copper migration (e.g., copper ion migration) leads to reflective force that opposes an electron migration force. To achieve the short line effect, the first conductive shunt 506 and the second conductive shunt 508 of the third conductive layer are two separate conductive shunts instead of one continuous conductive shunt that is substantially a same length as the first power rail 502. For example, the first conductive shunt 506 has a second line length L2, which is shorter than the first line length L1. Similarly, the second conductive shunt 508 has a third line length L3, which is shorter than the first line length L1. But each of the second line length L2 and the third line length L3 is shorter than a critical length Lc to achieve the short line effect.

The short line effect is described as follows. A stress gradient that builds up during copper migration (e.g., copper ion migration) leads to a back or reflective force that opposes the electron migration force. In short lines (e.g., first conductive shunt 506 having a second line length L2 or the second conductive shunt 508 having a third line length L3), a relatively small transfer of material is specified to produce a gradient sufficient to offset the electron migration force, halt the metal migration, and save the conductive shunt. Consequently, all conductive shunts whose length (e.g., second line length L2 or third line length L3) is shorter than the critical length Lc (e.g., as large as eight micrometers or more) are less subject to electron migration failure. Thus, the shorter lines are unable to generate sufficient stress to cause the line to rupture and the line is unable to grow a void to a size sufficient for failure to occur.

Accordingly, a maximum specified direct current Idc for the conductive shunts that have a length less than the critical length is much higher (e.g., three to four time higher) than the conventional continuous shunt power rail length that is substantially equal to the length of the underlying power rail (e.g., first power rail 502). The conductive shunts (e.g., the first conductive shunt 506 or the second conductive shunt 508) may have a width of twenty (20) to twenty five (25) nanometers. In some aspects, these ranges are associated with seven nanometer (7 nm) or five nanometer (5 nm) technology nodes.

Figure 6:
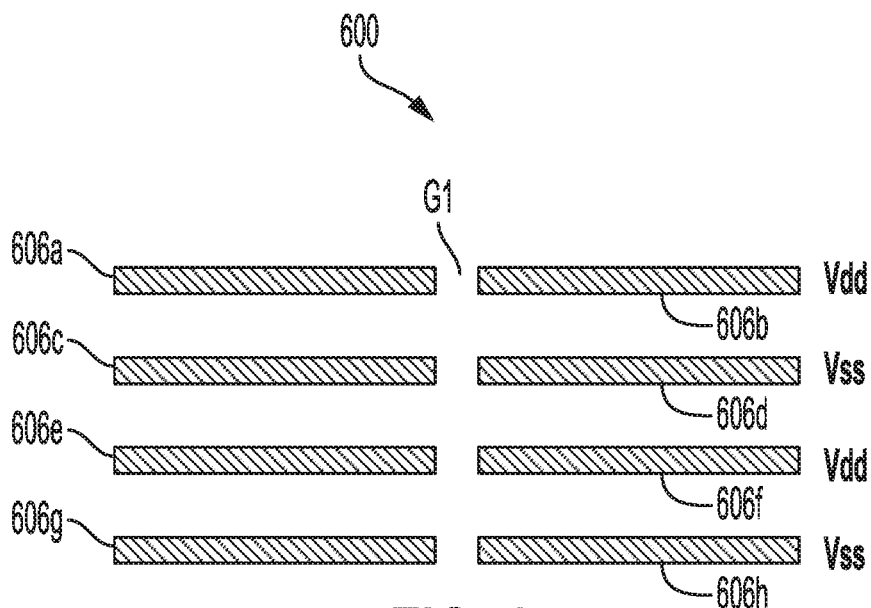
FIG. 6 illustrates a top view of a layout of a cell circuit in a short line configuration according, to aspects of the present disclosure.

FIG. 6 illustrates a top view of a layout of a cell circuit 600 in a short line configuration, according, to aspects of the present disclosure. The cell circuit 600 includes conductive shunts 606a-606h in a same conductive layer (e.g., the third conductive layer (e.g., M3) of FIG. 5).

Some of the conductive shunts (e.g., the conductive shunt 606a and the conductive shunt 606b) correspond to terminals that receive a positive supply voltage (Vdd). Other conductive shunts (e.g., the conductive shunt 606c and the conductive shunt 606d) correspond to terminals that receive a negative supply voltage (Vss). The negative and positive terminals can be laid out in an alternating configuration. For example, a first row of conductive shunts may include positive terminals corresponding to the conductive shunt 606a and the conductive shunt 606b and a second row immediately adjacent to the first row may include negative terminals corresponding to the conductive shunt 606c and the conductive shunt 606d, and the next row is a positive terminal, and so on.

The conductive shunts 606a-606h are grouped into rows and columns such that some conductive shunts (e.g., the conductive shunt 606a and the conductive shunt 606b) in a same row are aligned in a direction of the row and conductive shunts (e.g., the conductive shunt 606b, 606d, 606f and 606h) in a same column are aligned in a direction of the column. A gap G1 between the conductive shunt 606a and the conductive shunt 606b in a first row is the same and aligned with a gap between the conductive shunts in each of the other rows. This configuration mitigates shunt power rail electron migration while reducing place and route resource loss.

Figure 7:
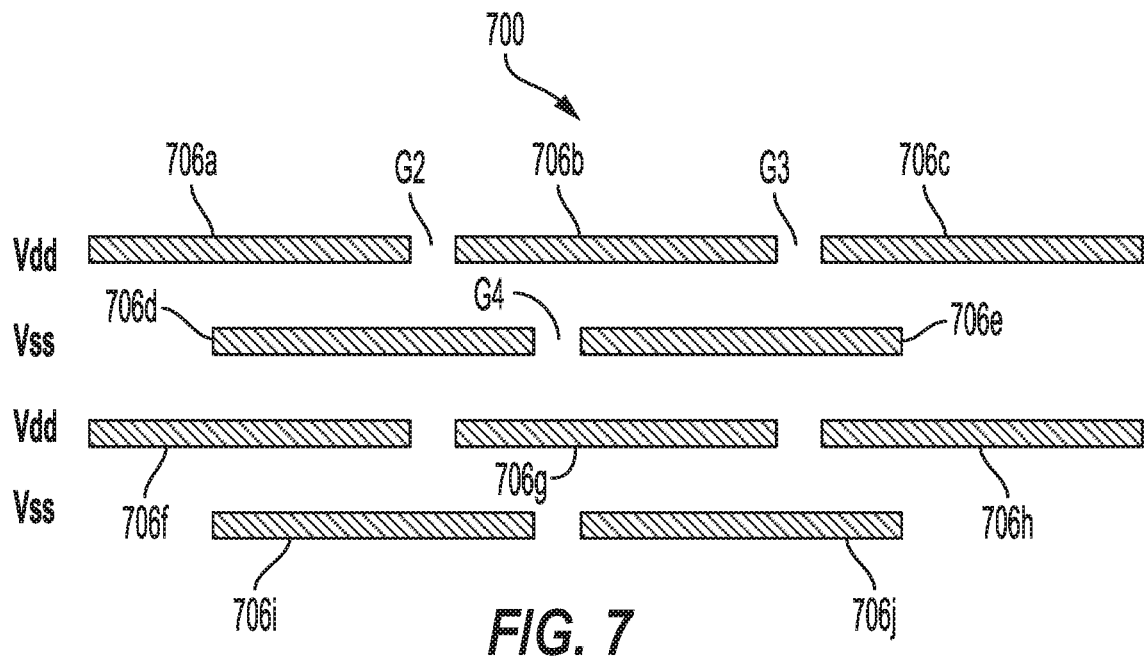
FIG. 7 illustrates a top view of another layout of a cell circuit in a short line configuration, according to aspects of the present disclosure.

FIG. 7 illustrates a top view of another layout of a cell circuit 700 in a short line configuration, according to aspects of the present disclosure. The cell circuit 700 includes conductive shunts 706a-706j in a same conductive layer (e.g., the third conductive layer (e.g., M3) of FIG. 5). The conductive shunts 706a-706j are grouped into rows and columns such that some conductive shunts (e.g., the conductive shunts 706a-706c) are staggered relative to other conductive shunts (e.g., the conductive shunt 706d and the conductive shunt 706e). In the staggered configuration, a gap G2 between the conductive shunt 706a and the conductive shunt 706b is staggered relative to a gap G4 between the conductive shunt 706d and the conductive shunt 706e. Similarly, a gap G3 between the conductive shunt 706b and the conductive shunt 706c is staggered relative to the gap G4 between the conductive shunt 706d and the conductive shunt 706e.

Some of the conductive shunts (e.g., the conductive shunt 706a, the conductive shunt 706b, and the conductive shunt 706c) correspond to terminals that receive a positive supply voltage (Vdd). Other conductive shunts (e.g., the conductive shunt 706d and the conductive shunt 706e) correspond to terminals that receive a negative supply voltage (Vss). The positive terminals and the negative terminals are laid out in the alternating configuration, as described with respect to FIG. 6. In some aspects, conductive shunts corresponding to terminals of a same polarity (e.g., positive or negative) may be aligned while conductive shunts corresponding to terminals of different polarity are not aligned. For example, the conductive shunt 706a, the conductive shunt 706b, and the conductive shunt 706c are aligned with the conductive shunt 706f, the conductive shunt 706g, and the conductive shunt 706h. The conductive shunt 706d and the conductive shunt 706e are aligned with the conductive shunt 706i and the conductive shunt 706j.

The different configurations incorporate different potential power net styles or patterns. For example, in real power net, there may be two different vertical positive supply voltage (Vdd) and negative supply voltage (Vss) configurations. One configuration includes separate or ungrouped positive and negative supply voltages in an alternative configuration, (e.g., ---Vdd-------Vss------Vdd Vss--) where Vdd represents vertical lines (not shown). Each "-" may illustrate a separation between the supply voltages. Another configuration includes grouped positive and negative supply voltages in a side-by-side configuration (e.g., ---Vdd-Vss------Vdd-Vss-------Vdd-Vss--). In this case a set of Vdd and Vss are grouped side-by-side as one set of vertical column similar to the Vdd and Vss configuration illustrated in FIG. 8. A staggered pattern is beneficial because IR drop can be mitigated in undesirable scenarios. For example, an undesirable (e.g., worst) device location for IR drop is between two vertical Vdd or Vss metal lines. With respect to aligned patterns, however, worst locations for Vdd and Vss IR drop are aligned.

Figure 8:
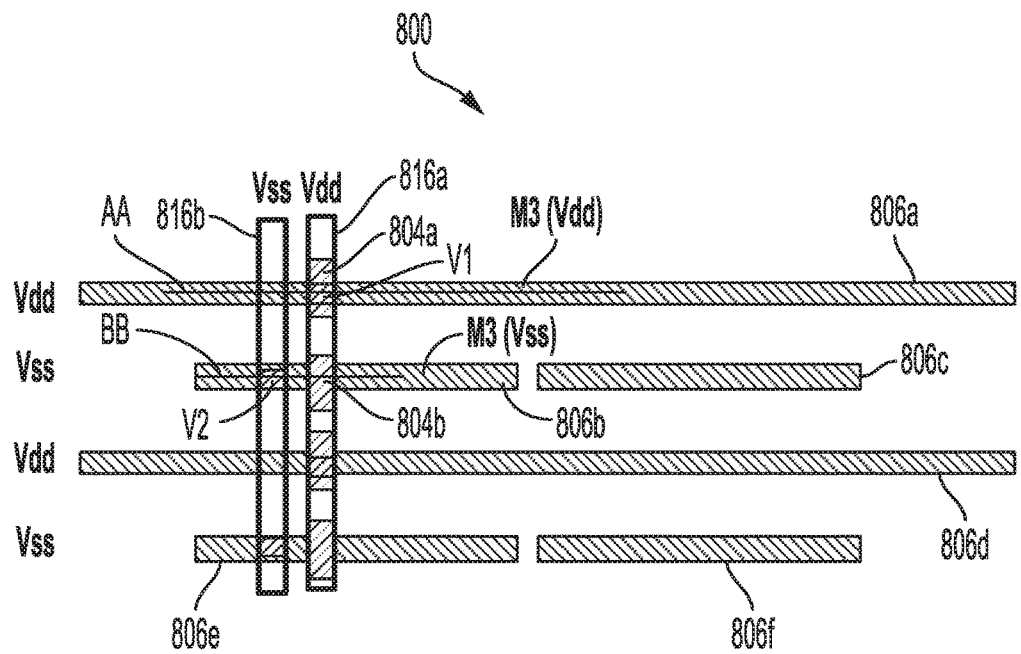
FIG. 8 illustrates a top view of a layout of a cell circuit in a short line configuration having multiple options for interconnecting to various layers of the cell circuit, according to aspects of the present disclosure.

FIG. 8 illustrates a top view of a layout of a cell circuit 800 in a short line configuration having multiple options for interconnecting to various layers of the cell circuit 800, according to aspects of the present disclosure. FIG. 8 illustrates different ways in which the conductive shunts are connected or coupled using vias to layers directly above and directly below the conductive shunts such that the positive voltages Vdd and the negative voltages Vss are provided to the various conductive layers. The cell circuit 800 includes conductive shunts 806a-806f in a same conductive layer (e.g., the third conductive layer (e.g., M3) of FIG. 5).

The conductive shunts 806a-806f are grouped into rows and columns such that some conductive shunts (e.g., the conductive shunt 806b, the conductive shunt 806c, the conductive shunt 806e, and the conductive shunt 806f) are laid out in accordance with a short line configuration, similar to the illustration in FIG. 6. The other conductive shunts (e.g., the conductive shunt 806a and the conductive shunt 806d) are in a continuous configuration like the first power rail 502 of FIG. 5.

Some of the conductive shunts (e.g., the conductive shunt 806a and the conductive shunt 806d) correspond to terminals that receive a positive supply voltage (Vdd). Other conductive shunts (e.g., the conductive shunt 806b, the conductive shunt 806c, the conductive shunt 806e, and the conductive shunt 806f) correspond to terminals that receive a negative supply voltage (Vss). The positive terminals and the negative terminals of the cell circuit 800 are laid out in an alternating configuration, similar to the illustration in FIG. 6.

The conductive shunt 806a and the conductive shunt 806d provide the positive voltages Vdd to the various conductive layers and the conductive shunt 806b, the conductive shunt 806c, the conductive shunt 806e, and the conductive shunt 806f provide the negative voltages Vss to the various conductive layers. For example, the conductive shunt 806a provides the positive voltage Vdd to a first conductive line 816a of a fourth conductive layer (e.g., M4) and to a second conductive line 804a (e.g., the conductive line 504a) of a second conductive layer (e.g., M2) through at least one via V1. The conductive shunt 806b provides the negative voltage Vss to a third conductive line 816b of the fourth conductive layer (e.g., M4) and to a fourth conductive line 804b (e.g., the conductive line 504b) of the second conductive layer (e.g., M2) through at least one via V2.

Figure 9:
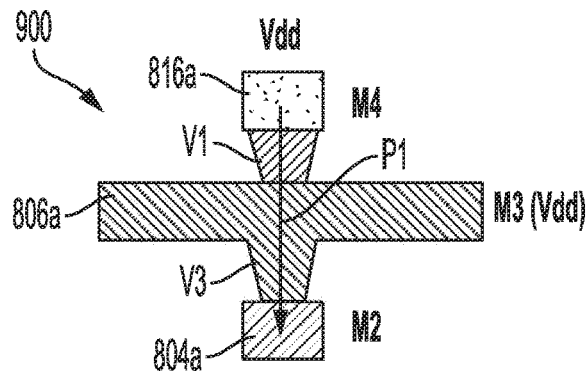
FIG. 9 illustrates a cross-section of a first interconnections option to the various layers of the cell circuit of FIG. 8, according to aspects of the present disclosure.

FIG. 9 illustrates a cross-section 900 of a first interconnection option to the various layers of the cell circuit 800 of FIG. 8, according to aspects of the present disclosure. The cross-section 900 is taken across a line AA, as shown in FIG. 8. FIG. 9 is focused on a direct interconnection from the first conductive line 816a of the fourth conductive layer (e.g., M4) to the second conductive line 804a of the second conductive layer (e.g., M2) through the conductive shunt 806a of the third conductive layer (e.g., M3), the via V1, and a via V3 in a substantially straight line path P1. Because the interconnection in FIG. 9 is direct and the signal does not flow along the length of the third conductive layer (e.g., M3) as it would if the first conductive line 816a and the second conductive line 804a were staggered, the signal path P1 is not affected or only mildly affected by electron migration on the conductive shunt 806a. Accordingly, the conductive shunt 806a is designed in a continuous configuration, much like the continuous configuration of the first power rail 502 of FIG. 5.

Figure 10:
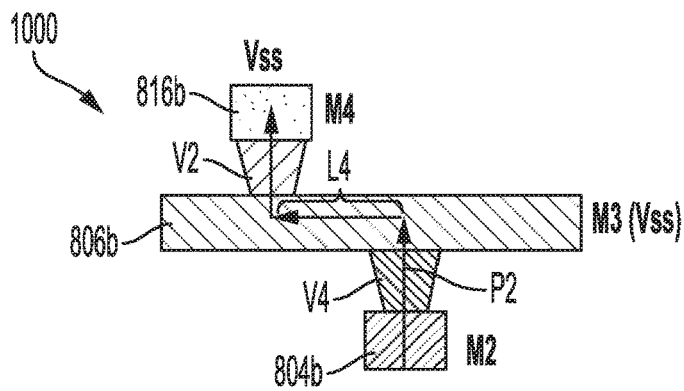
FIG. 10 illustrates a cross-section of a second interconnection option to the various layers of the cell circuit of FIG. 8, according to aspects of the present disclosure.

FIG. 10 illustrates a cross-section 1000 of a second interconnection option to the various layers of the cell circuit 800 of FIG. 8, according to aspects of the present disclosure. The cross-section 1000 is taken across a line BB, as shown in FIG. 8. FIG. 10 is focused on an indirect interconnection from the fourth conductive line 804b of the second conductive layer (e.g., M2) to the third conductive line 816b of the fourth conductive layer (e.g., M4) through the conductive shunt 806b of the third conductive layer (e.g., M3), the via V2, and the via V4 in a staggered line path P2. Because the interconnection in FIG. 10 is indirect and the signal flows along the length L4 of the conductive shunt 806b, the signal path P2 (which includes the length L4) is affected by electron migration on the conductive shunt 806b. Accordingly, the conductive shunt 806b is designed in accordance with a short line configuration as illustrated in FIG. 6 to mitigate the effects of the electron migration.

Figure 11:
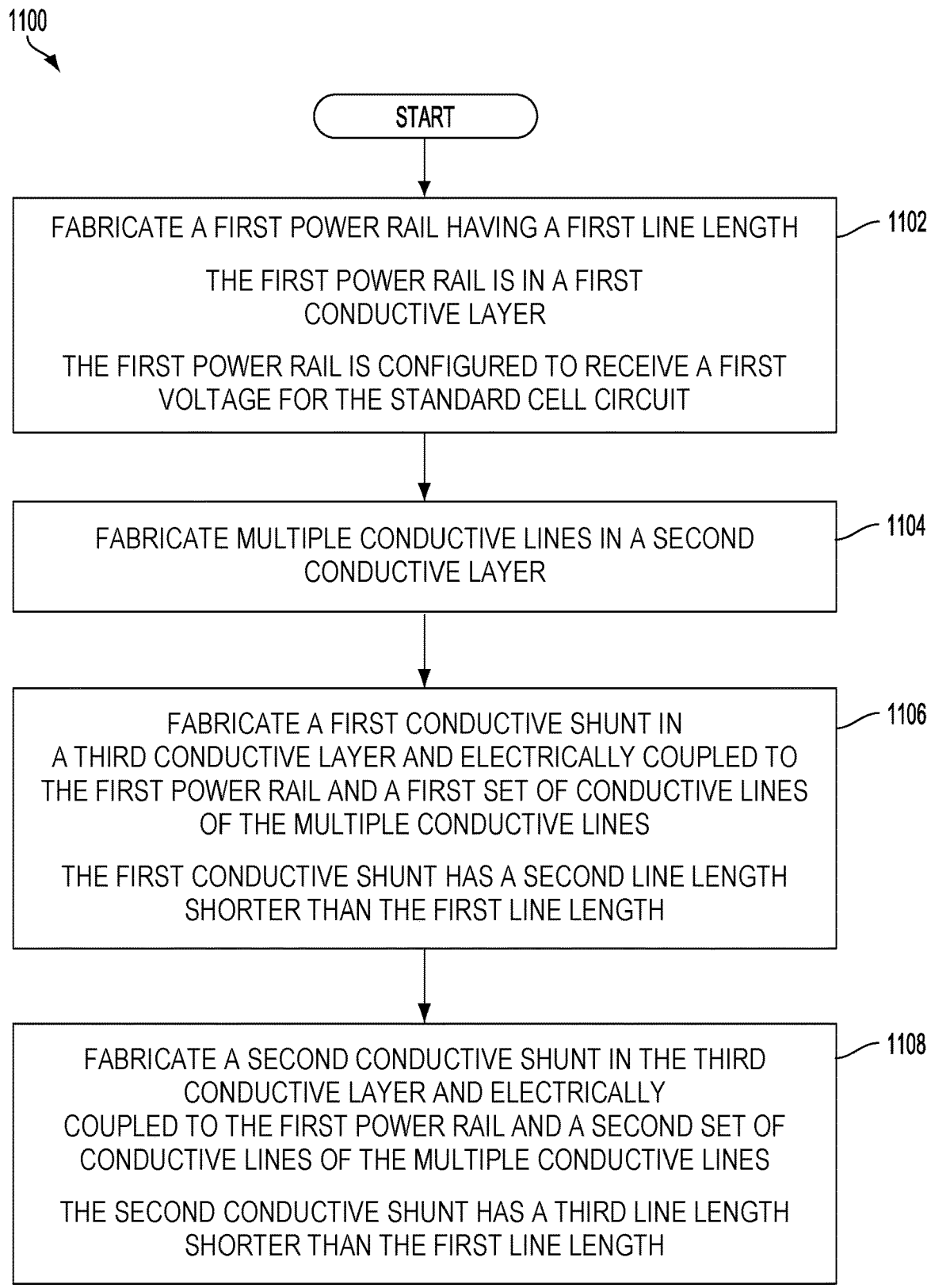
FIG. 11 depicts a simplified flowchart of a method of device fabrication, according to aspects of the present disclosure.

FIG. 11 depicts a simplified flowchart of a method 1100 for fabricating a cell circuit. At block 1102, a first power rail having a first line length is fabricated. The first power rail is in a first conductive layer (e.g., a first row of the first conductive layer). The first power rail is configured to receive a first voltage for the cell circuit. At block 1104, a plurality of conductive lines are fabricated in a second conductive layer. At block 1106, a first conductive shunt is fabricated in a third conductive layer (e.g., a first row of the third conductive layer). The first conductive shunt is electrically coupled to the first power rail and a first set of conductive lines of the plurality of conductive lines. The first conductive shunt has a second line length, which is shorter than the first line length. At block 1108, a second conductive shunt is fabricated in the third conductive layer (e.g., the first row of the third conductive layer). The first conductive shunt is electrically coupled to the first power rail and a second set of conductive lines of the plurality of conductive lines. The second conductive shunt has a third line length, which is shorter than the first line length.

According to a further aspect of the present disclosure, a cell structure is described. The cell structure includes means for receiving a first voltage for the cell circuit. The first voltage receiving means may be the first power rail 312*a* and/or first power rail 502, shown in FIGS. 3 and 5. The cell structure includes means for receiving a second voltage for the cell circuit. The second voltage receiving means may be the second power rail 312*b*, shown in FIG. 3. In another aspect, the aforementioned means may be any module or any apparatus configured to perform the functions recited by the aforementioned means.

Figure 12:
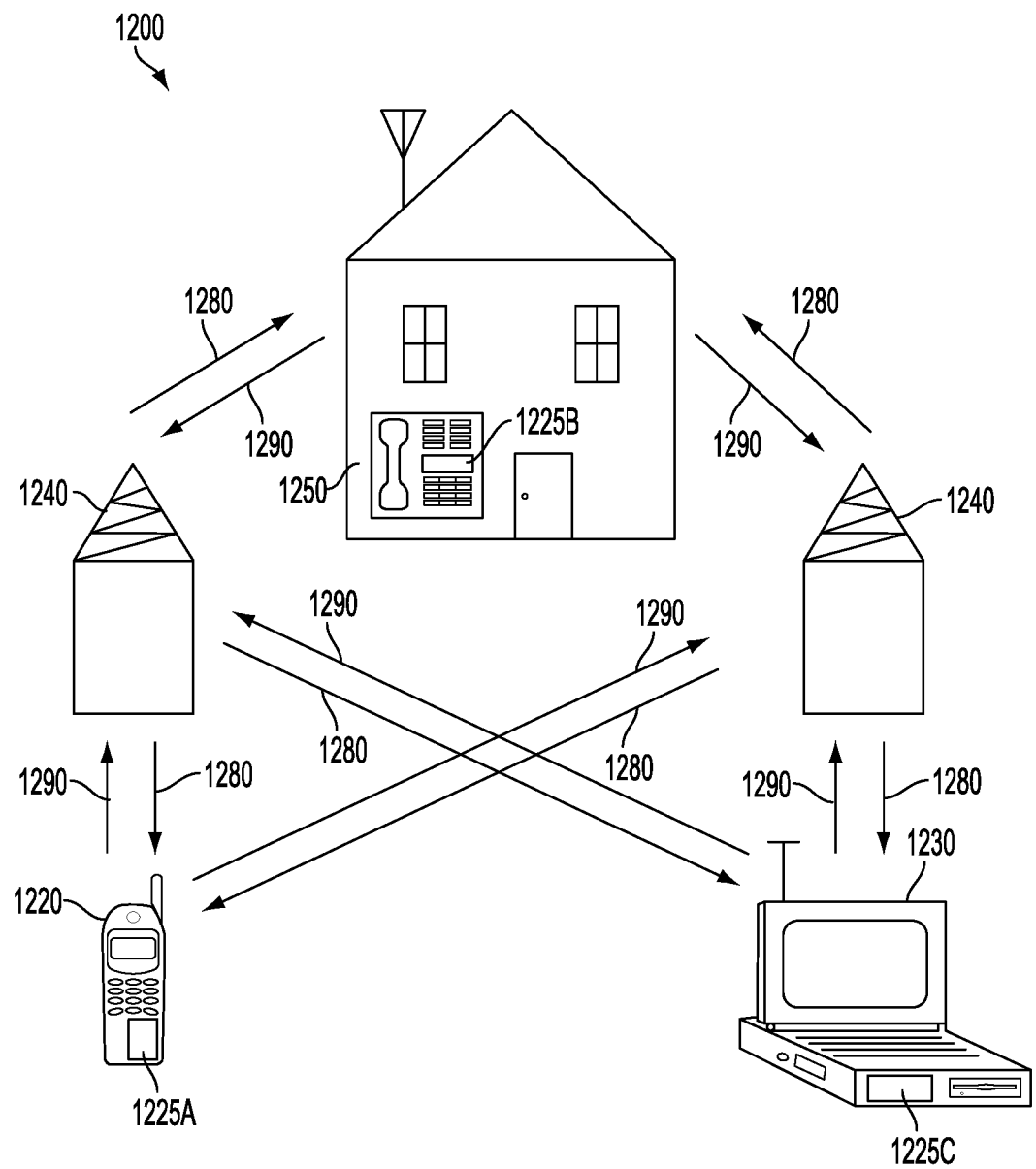
FIG. 12 is a block diagram showing an exemplary wireless communication system in which a configuration of the disclosure may be advantageously employed.

FIG. 12 is a block diagram showing an exemplary wireless communication system in which a configuration of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225B, and 1225C that include the disclosed cell circuit. It will be recognized that other devices may also include the disclosed cell circuit, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the cell circuit.

Figure 13:
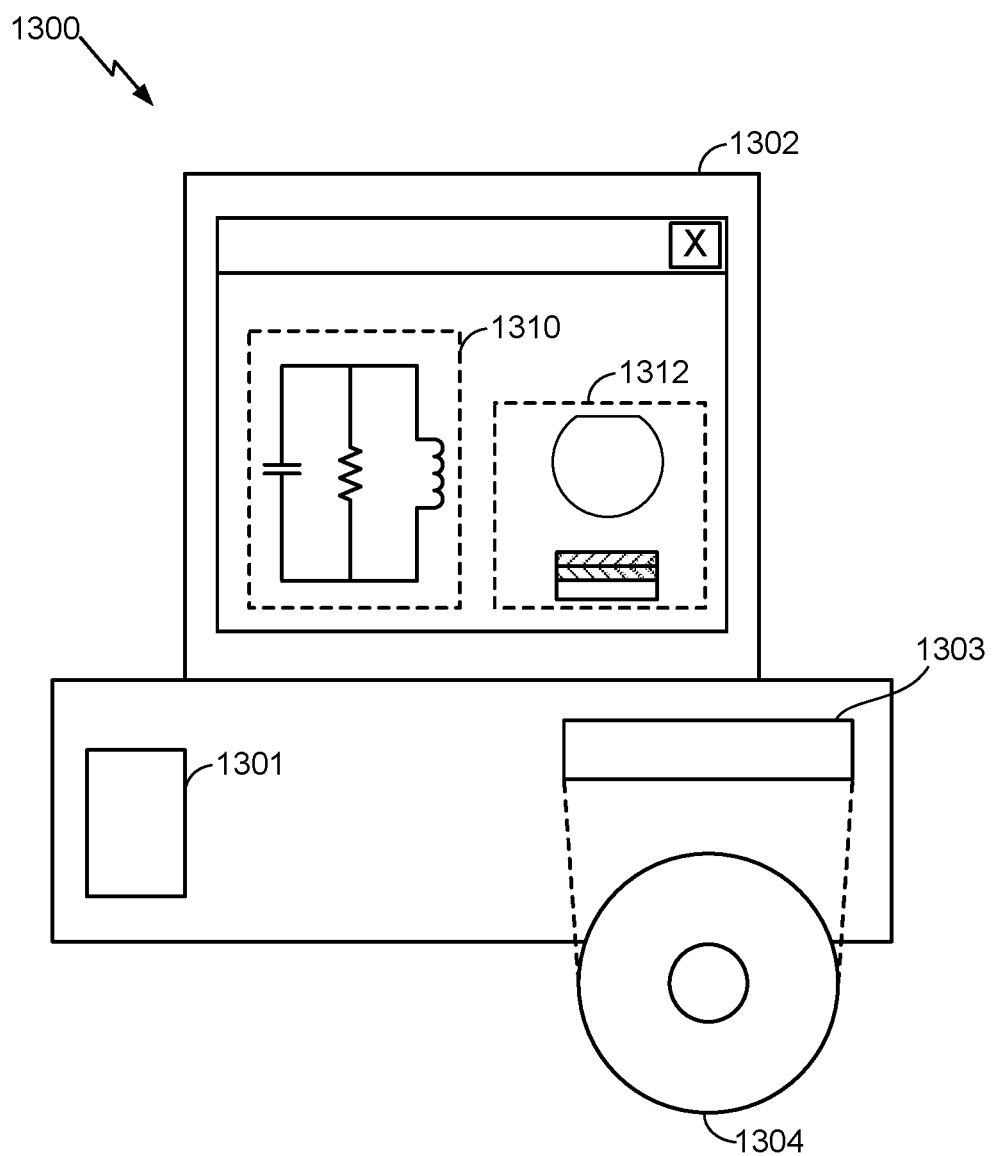
FIG. 13 is a block diagram illustrating a design workstation used for circuit, layout, and logic design of a cell circuit according to one configuration.

FIG. 13 is a block diagram illustrating a design workstation used for circuit, layout, and logic design of a cell circuit, such as the transistor array disclosed above. A design workstation 1300 includes a hard disk 1301 containing operating system software, support files, and design software such as Cadence or OrCAD. The design workstation 1300 also includes a display 1302 to facilitate design of a circuit 1310 or a cell circuit 1312. A storage medium 1304 is provided for tangibly storing the design of the circuit 1310 or the cell circuit 1312. The design of the circuit 1310 or the cell circuit 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the cell circuit 1312 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a cell circuit having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A cell circuit, comprising:
a first power rail having a first line length, the first power rail in a first conductive layer, the first power rail configured to receive a first voltage for the cell circuit;
a plurality of conductive lines in a second conductive layer;
a first conductive shunt in a third conductive layer and electrically coupled to the first power rail and a first set of conductive lines of the plurality of conductive lines, the first conductive shunt having a second line length shorter than the first line length;
a second conductive shunt in the third conductive layer and electrically coupled to the first power rail and a second set of conductive lines of the plurality of conductive lines, the second conductive shunt having a third line length shorter than the first line length;
a second power rail having a fourth line length, the second power rail in the first conductive layer, the second power rail configured to receive a second voltage for the cell circuit, the first voltage different from the second voltage; and
a continuous conductive shunt in the third conductive layer and electrically coupled to the second power rail and a third set of conductive lines of the plurality of conductive lines, the continuous conductive shunt having a fifth line length substantially equal to the fourth line length.

2. The cell circuit of claim 1, further comprising:
a first set of vias between the first conductive layer and the second conductive layer, each of the first set of vias electrically coupling the first power rail to the plurality of conductive lines in the second conductive layer;
a second set of vias between the second conductive layer and the first conductive shunt, each of the second set of vias electrically coupling the first set of conductive lines to the first conductive shunt; and
a third set of vias between the second conductive layer and the second conductive shunt, each of the third set of vias electrically coupling the second set of conductive lines to the second conductive shunt.

3. The cell circuit of claim 1, further comprising:
a second power rail having a fourth line length, the second power rail in the first conductive layer, the second power rail configured to receive a second voltage for the cell circuit, the first voltage different from the second voltage;
a third conductive shunt in the third conductive layer and electrically coupled to the second power rail and a third set of conductive lines of the plurality of conductive lines, the third conductive shunt having a fifth line length shorter than the fourth line length; and
a fourth conductive shunt in the third conductive layer and electrically coupled to the second power rail and a fourth set of conductive lines of the plurality of conductive lines, the fourth conductive shunt having a sixth line length shorter than the fourth line length.

4. The cell circuit of claim 3, in which a first gap between the first conductive shunt and the second conductive shunt is aligned with a second gap between the third conductive shunt and the fourth conductive shunt.

5. The cell circuit of claim 3, in which a first gap between the first conductive shunt and the second conductive shunt is staggered relative to a second gap between the third conductive shunt and the fourth conductive shunt.

6. The cell circuit of claim 1, in which each of the second line length and the third line length is between approximately two (2) micrometer (μm) and ten (10)μm.

7. A method of fabricating a cell circuit, comprising:
fabricating a first power rail having a first line length in a first conductive layer, the first power rail configured to receive a first voltage for the cell circuit;
fabricating a plurality of conductive lines in a second conductive layer;
fabricating a first conductive shunt in a third conductive layer and electrically coupled to the first power rail and a first set of conductive lines of the plurality of conductive lines, the first conductive shunt having a second line length shorter than the first line length;
fabricating a second conductive shunt in the third conductive layer and electrically coupled to the first power rail and a second set of conductive lines of the plurality of conductive lines, the second conductive shunt having a third line length shorter than the first line length;
fabricating a second power rail having a fourth line length, the second power rail in the first conductive layer, the second power rail configured to receive a second voltage for the cell circuit, the first voltage different from the second voltage;
fabricating a third conductive shunt in the third conductive layer and electrically coupled to the second power rail and a third set of conductive lines of the plurality of conductive lines, the third conductive shunt having a fifth line length shorter than the fourth line length; and
fabricating a fourth conductive shunt in the third conductive layer and electrically coupled to the second power rail and a fourth set of conductive lines of the plurality of conductive lines, the fourth conductive shunt having a sixth line length shorter than the fourth line length.

8. The method of claim 7, further comprising:
fabricating a first set of vias between the first conductive layer and the second conductive layer, each of the first set of vias electrically coupling the first power rail to the plurality of conductive lines in the second conductive layer;

fabricating a second set of vias between the second conductive layer and the first conductive shunt, each of the second set of vias electrically coupling the first set of conductive lines to the first conductive shunt; and fabricating a third set of vias between the second conductive layer and the second conductive shunt, each of the third set of vias electrically coupling the second set of conductive lines to the second conductive shunt.

9. The method of claim 7, further comprising aligning a first gap between the first conductive shunt and the second conductive shunt with a second gap between the third conductive shunt and the fourth conductive shunt.

10. The method of claim 7, further comprising staggering a first gap between the first conductive shunt and the second conductive shunt relative to a second gap between the third conductive shunt and the fourth conductive shunt.

11. The method of claim 7, further comprising:

fabricating a second power rail having a fourth line length, the second power rail in the first conductive layer, the second power rail configured to receive a second voltage for the cell circuit, the first voltage different from the second voltage; and fabricating a continuous conductive shunt in the third conductive layer and electrically coupled to the second power rail and a third set of conductive lines of the plurality of conductive lines, the continuous conductive shunt having a fifth line length substantially equal to the fourth line length.

12. A cell circuit, comprising:

means for receiving a first voltage for the cell circuit, the first voltage receiving means having a first line length, the first voltage receiving means in a first conductive layer;

a plurality of conductive lines in a second conductive layer;

a first conductive shunt in a third conductive layer and electrically coupled to the first voltage receiving means and a first set of conductive lines of the plurality of conductive lines, the first conductive shunt having a second line length shorter than the first line length;

a second conductive shunt in the third conductive layer and electrically coupled to the first voltage receiving means and a second set of conductive lines of the plurality of conductive lines, the second conductive shunt having a third line length shorter than the first line length;

means for receiving a second voltage for the cell circuit, the second voltage receiving means having a fourth line length, the second voltage receiving means in the first conductive layer, the first voltage different from the second voltage; and a continuous conductive shunt in the third conductive layer and electrically coupled to the second voltage receiving means and a third set of conductive lines of the plurality of conductive lines, the continuous conductive shunt having a fifth line length substantially equal to the fourth line length.

13. The cell circuit of claim 12, further comprising:

a first set of vias between the first conductive layer and the second conductive layer, each of the first set of vias electrically coupling the first voltage receiving means to the plurality of conductive lines in the second conductive layer;

a second set of vias between the second conductive layer and the first conductive shunt, each of the second set of vias electrically coupling the first set of conductive lines to the first conductive shunt; and a third set of vias between the second conductive layer and the second conductive shunt, each of the third set of vias electrically coupling the second set of conductive lines to the second conductive shunt.

14. The cell circuit of claim 12, further comprising:

means for receiving a second voltage for the cell circuit, the second voltage receiving means having a fourth line length, the second voltage receiving means in the first conductive layer, the first voltage different from the second voltage;

a third conductive shunt in a second row of the third conductive layer and electrically coupled to the second voltage receiving means and a third set of conductive lines of the plurality of conductive lines, the third conductive shunt having a fifth line length shorter than the fourth line length; and a fourth conductive shunt in the third conductive layer and electrically coupled to the second voltage receiving means and a fourth set of conductive lines of the plurality of conductive lines, the fourth conductive shunt having a sixth line length shorter than the fourth line length.

15. The cell circuit of claim 14, in which a first gap between the first conductive shunt and the second conductive shunt is aligned with a second gap between the third conductive shunt and the fourth conductive shunt.

16. The cell circuit of claim 14, in which a first gap between the first conductive shunt and the second conductive shunt is staggered relative to a second gap between the third conductive shunt and the fourth conductive shunt.

17. The cell circuit of claim 12, in which each of the second line length and the third line length is between approximately two (2) micrometer (μm) and ten (10)μm.

* * * * *